United States Patent
Mori

(10) Patent No.: US 10,957,378 B1
(45) Date of Patent: Mar. 23, 2021

(54) CONTROL CIRCUIT AND CONTROL METHOD THEREOF FOR PSEUDO STATIC RANDOM ACCESS MEMORY

(71) Applicant: Winbond Electronics Corp., Taichung (TW)

(72) Inventor: Kaoru Mori, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/724,414

(22) Filed: Dec. 23, 2019

(51) Int. Cl.
*G11C 7/22* (2006.01)
*G11C 7/10* (2006.01)
*G11C 11/406* (2006.01)
*G11C 11/419* (2006.01)
*G11C 11/4076* (2006.01)

(52) U.S. Cl.
CPC ...... *G11C 11/40615* (2013.01); *G11C 7/1072* (2013.01); *G11C 7/22* (2013.01); *G11C 7/222* (2013.01); *G11C 11/4076* (2013.01); *G11C 11/419* (2013.01)

(58) Field of Classification Search
CPC ......... G11C 7/1072; G11C 7/22; G11C 7/222; G11C 11/4076; G11C 11/419; G11C 11/40615
USPC .......................................... 365/233.16, 233.1
See application file for complete search history.

(56) References Cited

U.S. PATENT DOCUMENTS 10,643,689 B1 * 5/2020 Ikeda ..................... G11C 11/412
2007/0109828 A1 5/2007 Lee

FOREIGN PATENT DOCUMENTS

CN 102237128 11/2011
TW I644313 12/2018

* cited by examiner

*Primary Examiner* — Son L Mai
(74) *Attorney, Agent, or Firm* — JCIPRNET

(57) ABSTRACT

A control circuit and a control method thereof adapted to a pseudo static random access memory are provided. The control circuit includes a write data determining circuit and a clock generating circuit. The write data determining circuit counts and compares data input times and actual data write times of the pseudo static random access memory to generate a write matching signal, and generates a write counting clock signal according to counting operation of the data input times of the pseudo static random access memory. The clock generating circuit generates a preamble signal according to the write matching signal and the write counting clock signal, and generates a column address strobe clock signal and a control signal according to the preamble signal. The clock generating circuit determines whether to dynamically delay the preamble signal to delay or omit a pulse of a column selection line signal.

13 Claims, 13 Drawing Sheets

CONTROL CIRCUIT AND CONTROL METHOD THEREOF FOR PSEUDO STATIC RANDOM ACCESS MEMORY

BACKGROUND OF THE INVENTION

1. Field of the Invention

The present invention relates to a control circuit and a control method applied to a memory device, and in particular, to a control circuit and a control method applied to a pseudo static random access memory to generate a column address strobe clock signal and a control signal for the pseudo static random access memory to generate a column selection line signal.

2. Description of Related Art

As an integration level of a semiconductor memory element becomes increasingly high, there is a demand for a higher speed. Therefore, a static random access memory (SRAM) and a dynamic random access memory (DRAM) are used as high-speed memories. There is an increasing demand for a pseudo static random access memory (pSRAM) with advantages of the dynamic random access memory, especially in mobile devices.

In the pseudo static random access memory, since there is no update command issued by a user, the dynamic random access memory needs to perform a self-update operation. A conventional pseudo static random access memory is switched between a synchronous mode and an asynchronous mode using a counter. In the asynchronous mode, a write operation is asynchronously completed in a cycle shorter than a cycle of an external clock to absorb a time of the self-update operation. In the synchronous mode, the write operation is synchronously completed in a cycle same as the cycle of the external clock. However, in varied cases, the pseudo static random access memory fails in that a pulse width used to generate a column selection line signal (CSL signal) in the synchronous write mode is extremely short.

SUMMARY OF THE INVENTION

The present invention provides a control circuit and a control method thereof for a pseudo static random access memory, so that a pulse of a preamble signal used to generate a column selection line signal may be dynamically delayed or omitted during a write operation, thereby avoiding a failure of the pseudo static random access memory.

The control circuit of the present invention is applicable to a pseudo static random access memory. The control circuit includes a write data determining circuit and a clock generating circuit. The write data determining circuit is configured to: count and compare data input times of the pseudo static random access memory and actual data write times of the pseudo static random access memory to generate a write matching signal, and generate a write counting clock signal according to the counting of the data input times of the pseudo static random access memory. The clock generating circuit is coupled to the write data determining circuit, and is configured to: generate a preamble signal according to the write matching signal and the write counting clock signal, and generate a column address strobe clock signal and a control signal according to the preamble signal, where the clock generating circuit determines, according to the write matching signal and the write counting clock signal, whether to dynamically delay the preamble signal to delay or omit a pulse of a column selection line signal of the pseudo static random access memory.

The control method of the present invention is applicable to a pseudo static random access memory. The control method includes: counting and comparing data input times of the pseudo static random access memory and actual data write times of the pseudo static random access memory to generate a write matching signal, and generating a write counting clock signal according to the counting of the data input times of the pseudo static random access memory; and generating a preamble signal according to the write matching signal and the write counting clock signal, and generating a column address strobe clock signal and a control signal according to the preamble signal, where the step of generating the preamble signal according to the write matching signal and the write counting clock signal includes: determining, according to the write matching signal and the write counting clock signal, whether to dynamically delay the preamble signal to delay or omit a pulse of a column selection line signal of the pseudo static random access memory.

Based on the above, according to the control circuit and the control method of the present invention, a time sequence of the preamble signal is adjusted to generate a column selection line signal with an appropriate time sequence, thereby avoiding a failure or unstable operation of the pseudo static random access memory. In the present invention, the preamble signal is generated through counting and comparison of the data input times and the actual write times of the pseudo static random access memory, and it is determined whether to dynamically delay the preamble signal to delay or omit the pulse of the column selection line signal, thereby avoiding an excessively short with of the pulse of the column selection line signal. Therefore, a failure or unstable operation of the pseudo static random access memory can be avoided, and a necessary number of column selection line signals can be generated. According to the present invention, the pseudo static random access memory can achieve a higher operating frequency.

To make the features and advantages of the invention clear and easy to understand, the following gives a detailed description of embodiments with reference to accompanying drawings.

DESCRIPTION OF THE EMBODIMENTS

Figure 1:
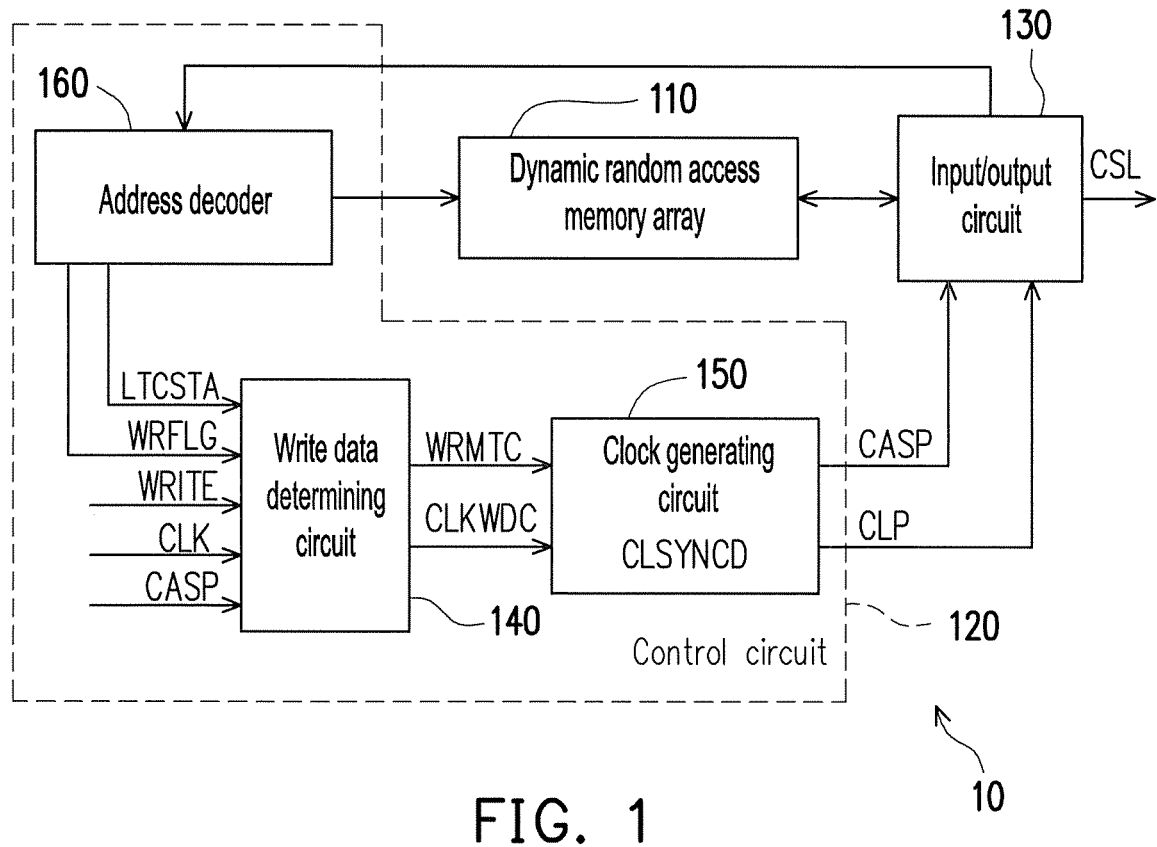
FIG. 1 is a schematic diagram of a pseudo static random access memory according to an embodiment of the present invention.

Referring to FIG. 1, FIG. 1 is a schematic diagram of a pseudo static random access memory 10 according to an embodiment of the present invention. The pseudo static random access memory 10 includes a dynamic random access memory array 110, a control circuit 120, and an input/output circuit 130. The dynamic random access memory array 110 includes a plurality of word lines and a plurality of memory cells (not shown) for storing data. An architecture of the dynamic random access memory array is not limited in the present invention. The control circuit 120 is coupled to the dynamic random access memory array 110. The control circuit 120 includes a write data determining circuit 140, a clock generating circuit 150, and an address decoder 160. The address decoder 160 is coupled to the write data determining circuit 140, the dynamic random access memory array 110, and the input/output circuit 130. The address decoder 160 can generate a count start signal LTCSTA and a write flag signal WRFLG corresponding to an operation, and provides the count start signal LTCSTA and the write flag signal WRFLG to the write data determining circuit 140. The write data determining circuit 140 receives the count start signal LTCSTA, the write flag signal WRFLG, a write control signal WRITE, a reference clock signal CLK, and a column address strobe clock signal CASP, and generates a write matching signal WRMTC and a write counting clock signal CLKWDC according to the signals. The clock generating circuit 150 is coupled between the write data determining circuit 140 and the input/output circuit 130. The clock generating circuit 150 receives the write matching signal WRMTC and the write counting clock signal CLKWDC, and generates a preamble signal CLSYNCD according to the signals, and generates a column address strobe clock signal CASP and a control signal CLP according to the preamble signal. The clock generating circuit 150 determines, according to the write matching signal WRMTC and the write counting clock signal CLKWDC, whether to dynamically delay the preamble signal CLSYNCD to delay or omit a pulse of a column selection line CSL signal. The input/output circuit 130 is coupled to the dynamic random access memory array 110 and the control circuit 120. Further, the input/output circuit 130 is coupled between the address decoder 160 and the clock generating circuit 150. The input/output circuit 130 receives the column address strobe clock signal CASP and the control signal CLP from the control circuit 120 to generate a column selection line CSL signal, and sequentially writes write data into the dynamic random access memory array 110 according to the column selection line CSL signal.

In FIG. 1, the write data determining circuit 140 is configured to: count and compare data input times of the pseudo static random access memory 10 and actual data write times of the pseudo static random access memory to generate a write matching signal WRMTC. The data input times are times that data is input into the pseudo static random access memory 10 from an outside of the pseudo static random access memory 10 according to the reference clock signal CLK, and the actual data write times are times that the data is written into the dynamic random access memory array 110 from an inside of the pseudo static random access memory 10 according to the column address strobe clock signal CASP. The write data determining circuit 140 then generates a write counting clock signal CLKWDC according to the counting operation of the data input times of the pseudo static random access memory. A manner of generating the write counting clock signal CLKWDC is described below. When the data input times that the data is written into the dynamic random access memory array 110 is equal to the data actual input times that the data is input into the pseudo static random access memory 100 from the outside, the write matching signal WRMTC is at a low logic level to indicate that a speed at which the data is written into the dynamic random access memory array 110 is already equivalent to a speed at which the data is input to the input/output circuit 130 from an outside.

The clock generating circuit 150 is configured to: when receiving a write matching signal WRMTC at a low logic level, dynamically delay the preamble signal CLSYNCD based on the matching signal WRMTC at a low logic level and the write counting clock signal CLKWDC to dynamically adjust time sequences of the column address strobe clock signal CASP and the control signal CLP. The clock generating circuit 150 then adjusts a cycle of the column address strobe clock signal CASP to be the same as a cycle of the reference clock signal CLK, so that the write operation may be switched from an asynchronous mode to a synchronous mode.

Figure 2:
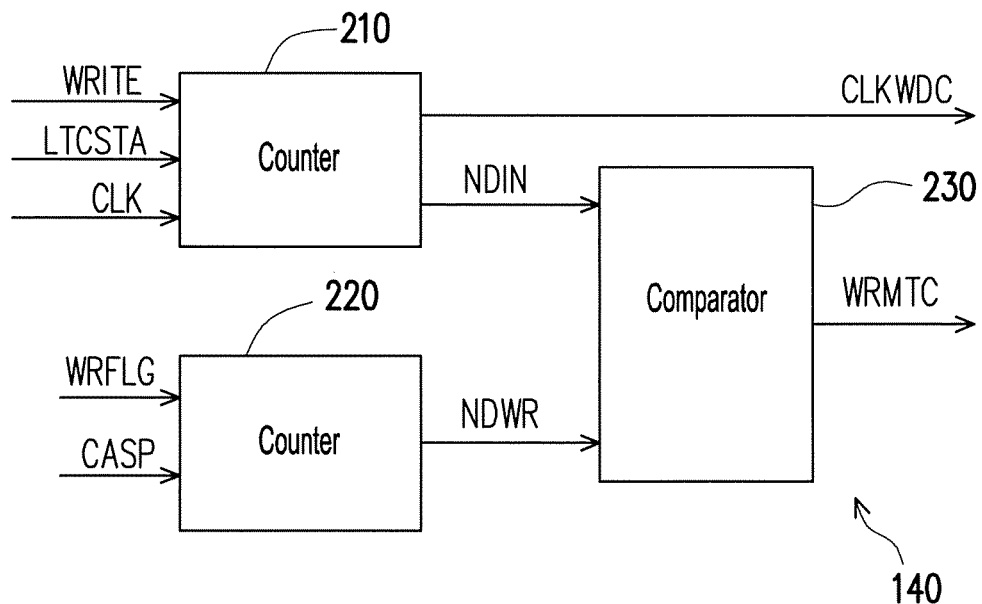
FIG. 2 is a schematic diagram of a write data determining circuit according to an embodiment of the present invention.

In an embodiment, when the data input times are greater than the actual data write times, the clock generating circuit 150 adjusts the time sequences of the column address strobe clock signal CASP and the control signal CLP, so that the pseudo static random access memory 10 performs an asynchronous write operation in a cycle shorter than the cycle of the reference clock signal CLK. When the data input times are less than or equal to the actual data write times, the clock generating circuit 150 adjusts the time sequences of the column address strobe clock signal CASP and the control signal CLP, so that the pseudo static random access memory 10 performs a synchronous write operation in a cycle same as the cycle of the reference clock signal CLK. FIG. 2 is a schematic diagram of a write data determining circuit 140 according to an embodiment of the present invention. Referring to FIG. 2, the write data determining circuit 140 includes a counter 210, a counter 220, and a comparator 230.

The counter 210 receives a write control signal WRITE, a count start signal LTCSTA, and a reference clock signal CLK. During a write operation, the counter 210 counts, according to the write control signal WRITE, the count start signal LTCSTA, and the reference clock signal CLK, "times that data is input into the pseudo static random access memory 10 from an outside of the pseudo static random access memory 10", to generate the data input times NDIN.

The counter 220 receives the write flag signal WRFLG and the column address strobe clock signal CASP. During the write operation, the counter 220 counts, according to the write flag signal WRFLG and the column address strobe clock signal CASP, "times that data is written into the dynamic random access memory array 110 from an inside of the pseudo static random access memory 10", to generate actual data write times NDWR.

The comparator 230 is coupled to the counter 210 and the counter 220. The comparator 230 is configured to compare the data input times NDIN to the actual data write times NDWR. When the data input times NDIN are equal to the actual data write times NDWR, a write matching signal WRMTC is at a low logic level. When the data input times NDIN are greater than the actual data write times NDWR, a write matching signal WRMTC is at a high logic level. In an embodiment, the counter 210 further generates a write counting clock signal CLKWDC according to the write control signal WRITE, the count start signal LTCSTA, and the reference clock signal CLK, and provides the write counting clock signal to the clock generating circuit 150 as a preamble control signal for the clock generating circuit 150 to perform asynchronization control.

Figure 3:
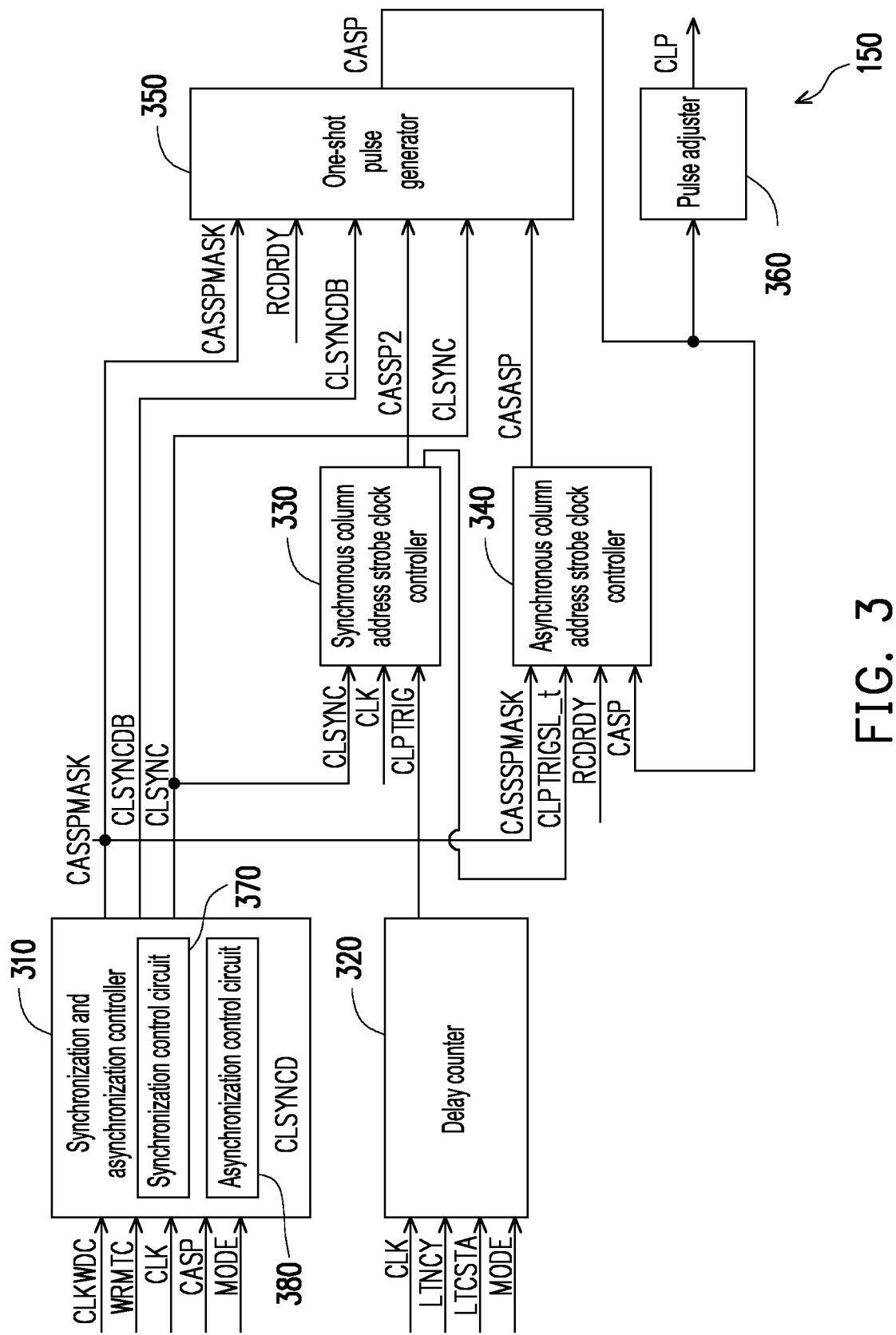
FIG. 3 is a schematic diagram of a clock generating circuit according to an embodiment of the present invention.

FIG. 3 is a schematic diagram of a clock generating circuit 150 according to an embodiment of the present invention. Referring to FIG. 3, the clock generating circuit 150 includes a synchronization and asynchronization controller 310, a delay counter 320, a synchronous column address strobe clock controller 330, an asynchronous column address strobe clock controller 340, a one-shot pulse generator 350, and a clock adjuster 360. The delay counter 320 and the clock adjuster 360 may be a conventional counter and a conventional delay circuit respectively, but the present invention is not limited thereto.

The synchronization and asynchronization controller 310 is coupled to the write data determining circuit 140, and has a synchronization control circuit 370 and an asynchronization control circuit 380. The synchronization and asynchronization controller 310 receives the write counting clock signal CLKWDC, the write matching signal WRMTC, the reference clock signal CLK, the column address strobe clock signal CASP, and a mode signal MODE corresponding to an operation mode. The synchronization and asynchronization controller 310 determines, according to the write matching signal WRMTC, whether the reference clock signal CLK and the column address strobe clock signal CASP are in synchronization and perform synchronization control to generate a synchronization determining signal CLSYNC and the preamble signal CLSYNCD, and performs asynchronization control according to the write counting clock signal CLKWDC, the synchronization determining signal CLSYNC and the preamble signal CLSYNCD to generate a synchronization basis generation-forbidding signal CASSPMASK and an inverting preamble signal CLSYNCDB.

The delay counter 320 receives the reference clock signal CLK, a delay control signal LTNCY, the count start signal LTCSTA, and the mode signal MODE. The delay counter 320 performs counting according to the delay control signal LTNCY, the count start signal LTCSTA, and the mode signal MODE to generate a trigger status signal CLPTRIG, and provides the trigger status signal to the synchronous column address strobe clock controller 330 and the asynchronous column address strobe clock controller 340. When a predetermined delay time elapses after the counting starts according to the count start signal LTCSTA, the delay counter 320 generates a trigger status signal CLPTRIG at a high logic level.

The synchronous address strobe clock controller 330 is coupled to the synchronization and asynchronization controller 310 and the delay counter 320. The synchronous column address strobe clock controller 330 receives the synchronization determining signal CLSYNC, the reference clock signal CLK, and the trigger status Signal CLPTRIG. When the synchronization determining signal CLSYNC and the trigger status signal CLPTRIG are both at a high logic level, it indicates that the mode is switched to the synchronous mode. The synchronous column address strobe clock controller 330 may generate a synchronization basis signal CASSP2 according to the reference clock signal CLK.

The asynchronous column address strobe clock controller 340 is coupled to the synchronization and asynchronization controller 310, the synchronous column address strobe clock controller 330, and the one-shot pulse generator 350, and receives the synchronization basis generation-forbidding signal CASSPMASK, a trigger control signal CLPTRIGSL_t, a delay ready signal RCDRDY, and the column address strobe clock signal CASP. When the delay ready signal RCDRDY is at a high logic level and the synchronization determining signal CLSYNC is at a low logic level, it indicates that the mode is currently an asynchronous mode. Therefore, the asynchronous column address strobe clock controller 340 may correspondingly generate an asynchronous basis signal CASASP. Further, in the asynchronous mode, the asynchronous column address strobe clock controller 340 may correspondingly generate the asynchronous basis signal CASASP according to the synchronization basis generation-forbidding signal CASSPMASK, the trigger control signal CLPTRIGSL_t, the delay ready signal RCDRDY, and the column address strobe clock signal CASP, and provides the synchronization basis generation-forbidding signal to the one-shot pulse generator 350. When the delay ready signal RCDRDY is at a high logic level, it indicates that a row address system operation, for example, driving of a word line and a sense amplifier is completed, and a column address system operation may be ready to start. In other words, during a write operation, data may be started to be written into a memory cell of the dynamic random access memory array 110 from a buffer in the input/output circuit 130. The delay ready signal RCDRDY is a status signal. When a transmission delay time tRCD (not shown) is internally transmitted to a column controller via a row controller generation of the column selection line CSL signal is ready, the delay ready signal RCDRDY is transitioned to be at a high logic level. It needs to be noted that after a startup state is completed, the control circuit 120 resets the delay ready signal RCDRDY.

The one-shot pulse generator 350 is coupled to the synchronization and asynchronization controller 310, the synchronous column address strobe clock controller 330, the asynchronous column address strobe clock controller 340, and the one-shot pulse generator 350, and receives the synchronization basis generation-forbidding signal CASSPMASK, the delay ready signal RCDRDY, the inverting preamble signal CLSYNCDB, the synchronization basis signal CASSP2, the synchronization determining signal CLSYNC, and an asynchronization basis signal CASASP. In an embodiment, the one-shot pulse generator 350 correspondingly generates a column address strobe clock signal CASP according to the asynchronization basis signal CASASP in the asynchronous mode, and correspondingly generates a column address strobe clock signal CASP according to the synchronization basis signal CASSP2 in the synchronous mode. In an embodiment, the one-shot pulse generator 350 may, for example, select the asynchronization basis signal CASASP and the synchronization basis signal CASSP2 through an OR operation, and generates a one-shot pulse with a predetermined pulse width according to the selected signal after the delay ready signal RCDRDY is at a high logic level to form the column address strobe clock signal CASP. The column address strobe clock signal CASP is further fed back to the asynchronous column address strobe clock controller 340 to adjust a subsequent asynchronization basis signal CASASP.

The clock adjuster 360 is coupled to the one-shot pulse generator 350. The clock adjuster 360 receives the column address strobe clock signal CASP and generates a control signal CLP after a predetermined delay time according to the column address strobe clock signal CASP.

Figure 4C:
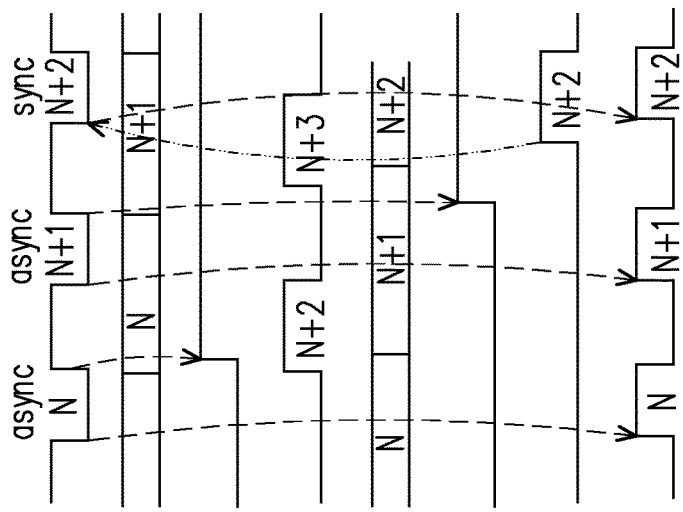
FIG. 4A to FIG. 4C are time sequence diagrams of a control signal for switching between an asynchronous mode and a synchronous mode according to an embodiment of the present invention.
Figure 4B:
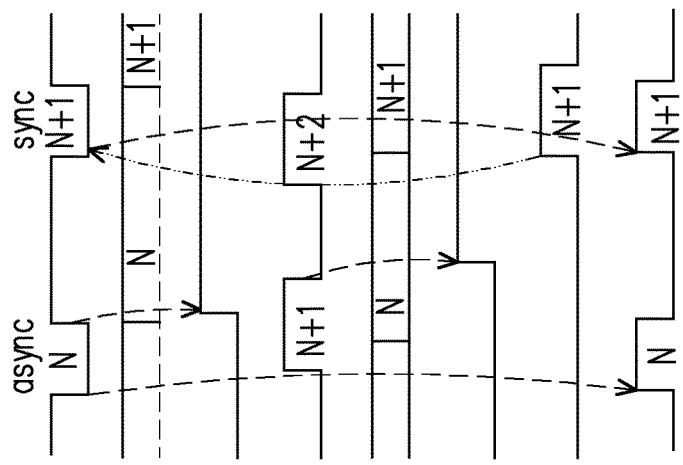
Figure 4A:
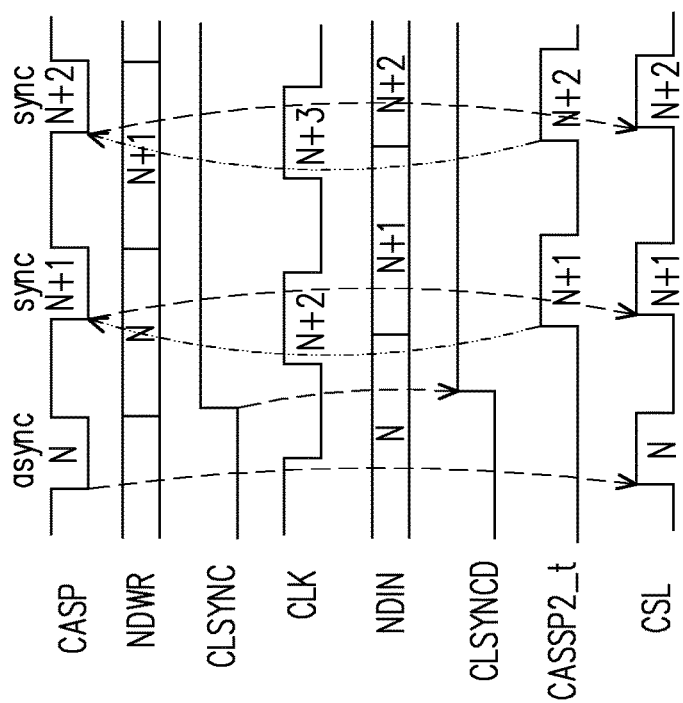

FIG. 4A to FIG. 4C are time sequence diagrams of a control signal for switching between an asynchronous mode and a synchronous mode according to an embodiment of the present invention. Referring to all of FIG. 1, FIG. 3, and FIG. 4A to FIG. 4C, an operating mode of the control circuit 120 is switched between the asynchronous mode and the synchronous mode based on operating waveforms of the column address strobe clock signal CASP, the synchronization determining signal CLSYNC, and the preamble signal CLSYNCD. In particular, when the column address strobe clock signal CASP is transitioned to be at a high logic level, the synchronization determining signal CLSYNC is transitioned to be at a high logic level. The preamble signal CLSYNCD is transitioned to be at a high logic level, for example, after the synchronization determining signal CLSYNC is transitioned to be at a high logic level and when the reference clock signal CLK is at a low logic level. For example, in a scenario in FIG. 4A, when the synchronization determining signal CLSYNC is transitioned to be at a high logic level, since the reference clock signal CLK is currently at a low logic level, the control circuit 120 transitions the preamble signal CLSYNCD to be at a high logic level after an operation, and then a pulse N+1 and a pulse N+2 of the synchronization basis signal CASSP2 are sequentially generated after the preamble signal CLSYNCD is transitioned to be at a high logic level, and respectively become a basis for generating a pulse N+1 and a pulse N+2 of the column address strobe clock signal CASP. A pulse N, a pulse N+1, and a pulse N+2 of the column selection line CSL signal are respectively synchronized with a pulse N, a pulse N+1, and a pulse N+2 of the column address strobe clock signal CASP. In a scenario in FIG. 4B, when the synchronization determining signal CLSYNC is transitioned to be at a high logic level, since the reference clock signal CLK is currently at a high logic level, the control circuit 120 transitions the preamble signal CLSYNCD to be at a high logic level though an operation after the reference clock signal CLK is transitioned to be at a low logic level. A pulse N+1 of the synchronization basis signal CASSP2 is then generated after the preamble signal CLSYNCD is transitioned to be at a high logic level, and becomes a basis for generating a pulse N+1 of the column address strobe clock signal CASP. A pulse N and a pulse N+1 of the column selection line CSL signal are respectively synchronized with a pulse N and a pulse N+1 of the column address strobe clock signal CASP. Therefore, in the scenario in FIG. 4B, a pulse N+1 of the column selection line CSL signal generated based on the pulse N+1 of the synchronization basis signal CASSP2 is delayed to avoid a failure of the pseudo static random access memory 10 as a result of an excessively short width of the pulse N+1. In a scenario in FIG. 4C, when the synchronization determining signal CLSYNC is transitioned to be at a high logic level, the reference clock signal CLK is currently at a high logic level. When the reference clock signal CLK is transitioned to be at a low logic level, the column address strobe clock signal CASP is at a low logic level. Therefore, when the column address strobe clock signal CASP is transitioned to be at a high logic level, the control circuit 120 transitions the preamble signal CLSYNCD to be at a high logic level after an operation. A pulse N+2 of the synchronization basis signal CASSP2 is then generated after the preamble signal CLSYNCD is transitioned to be at a high logic level, and becomes a basis for generating a pulse N+2 of the column address strobe clock signal CASP. Therefore, in the scenario in FIG. 4C, a pulse N+1 of the column selection line CSL signal generated based on the pulse N+1 of the synchronization basis signal CASSP2 is omitted to avoid a failure of the pseudo static random access memory 10 as a result of an excessively short width of the pulse N+1.

Figure 5A:
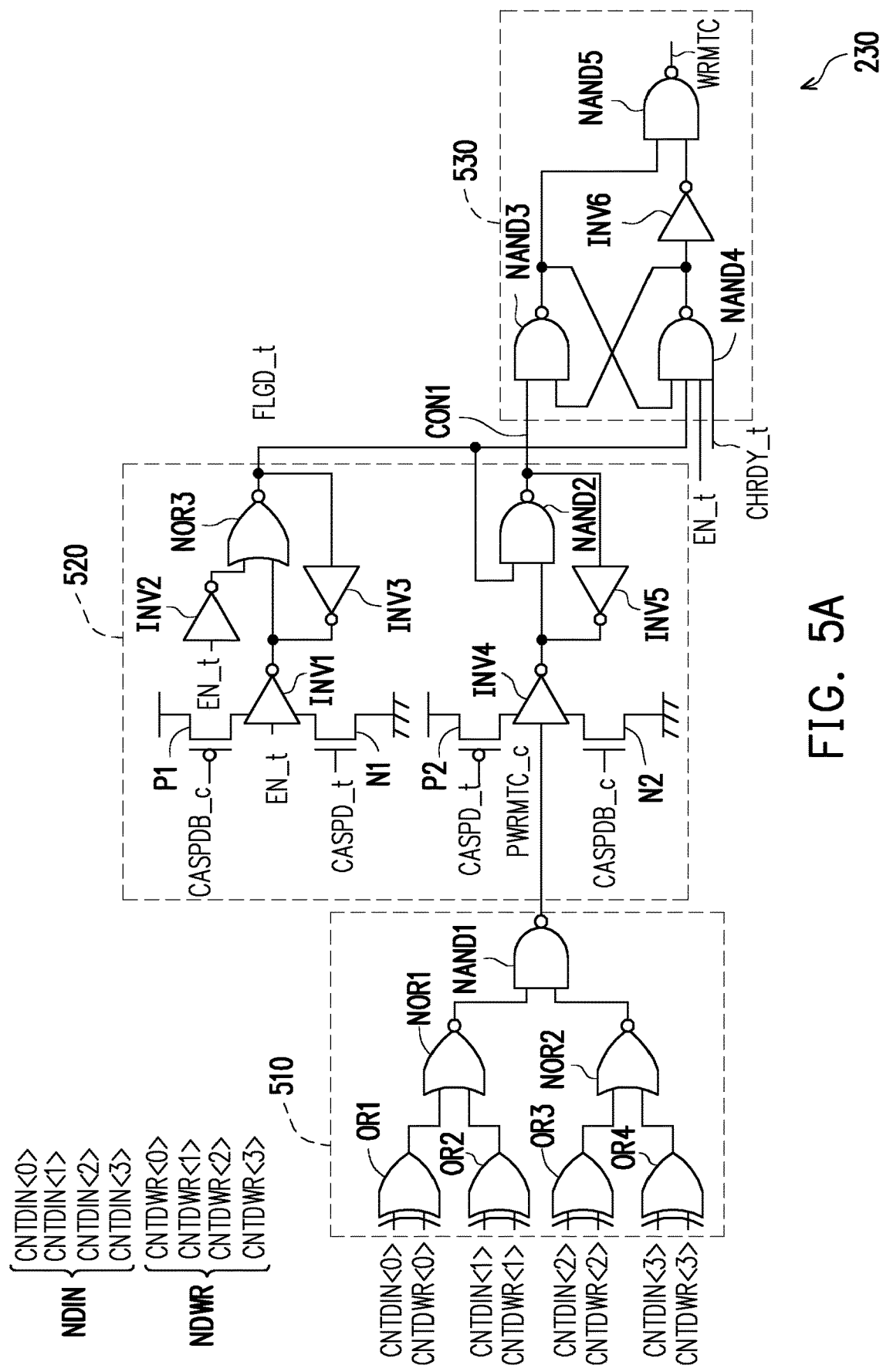
FIG. 5A is a circuit diagram of a comparator according to an embodiment of the present invention.

FIG. 5A is a circuit diagram of a comparator 230 according to an embodiment of the present invention. Referring to both FIG. 2 and FIG. 5A, the comparator 230 is configured to compare the data input times NDIN to the actual data write times NDWR. When the data input times NDIN are equal to the actual data write times NDWR, a write matching signal WRMTC is transitioned to be at a high logic level.

A logic circuit 510 is coupled to the counter 210 and the counter 220. The logic circuit 510 receives the data input times NDIN and the actual data write times NDWR, and generates a control signal PWRMTC_c through a logic operation. In particular, the logic circuit 510 includes OR gates OR1-OR4, NOR gates NOR1-NOR2, and a NAND gate NAND1. The data input time NDIN includes a data input time CNTDIN<3:0>, and the actual data write time NDWR includes an actual data write time CNTDWR<3:0>. The OR gate OR1 receives a data input time CNTDIN<0> and an actual data write time CNTDWR<0>, the OR gate OR2 receives a data input time CNTDIN<1> and an actual data write time CNTDWR<1>, the OR gate OR3 receives a data input time CNTDIN<2> and an actual data write time CNTDWR<2>, and the OR gate OR4 receives a data input time CNTDIN<3> and an actual data write time CNTDWR<3>. The logic circuit 510 generates the control signal PWRMTC_c using the NAND gate NAND1 after a logic operation performed using the OR gates OR1-OR4, the NOR gates NOR1-NOR2, and the NAND gate NAND1.

A logic circuit 520 is coupled to the logic circuit 510. The logic circuit 520 receives a control signal EN_t and the control signal PWRMTC_c, and generates a flag signal FLGD_t and a control signal CON1 after a logic operation. In particular, the logic circuit 520 includes transistors P1-P2, transistors N1-N2, inverting gates INV1-INV5, a NOR gate NOR3, and a NAND gate NAND2. A gate of the transistor P1 receives a control signal CASPDB_c, inputs of the inverting gate INV1 and the inverting gate INV2 receive the control signal EN_t, and a gate of the transistor N1 receives a control signal CASPD_t. A gate of the transistor P2 receives the control signal CASPD_t, an input of the inverting gate INV4 receives the control signal PWRMTC_c, and a gate of the transistor N2 receives the control signal CASPDB_c. The logic circuit 520 generates the flag signal FLGD_t and the control signal CON1 using the NOR gate NOR3 and the NAND gate NAND2 after a logic operation performed using the transistors P1-P2, the transistors N1-N2, and the inverting gates INV1-INV5, the NOR gate NOR3, and the NAND gate NAND2.

A logic circuit 530 is coupled to the logic circuit 520. The logic circuit 530 receives a flag signal FLGD_t and the control signal CON1, and generates a write matching signal WRMTC after a logic operation. In particular, the logic circuit 530 includes NAND gates NAND3-NAND5 and an inverting gate INV6. An input of the NAND gate NAND3 receives the control signal CON1, and an input of the NAND gate NAND4 receives the flag signal FLGD_t, the control signal EN_t, and a chip charging ready confirmation signal CHRDY_t. The logic circuit 530 generates the write matching signal WRMTC using the NAND gate NAND5 after a logic operation performed using the NAND gates NAND3-NAND5 and the inverting gate INV6.

Referring to FIG. 5A, the data input time CNTDIN <3:0> is compared to the actual data writes CNTDWR <3:0>. A comparison result is latched based on time sequences of the control signal CASPD_t and the control signal CASPDB_c. The control signal CASPD_t and the control signal CASPDB_c are generated through delaying of the column address strobe clock signal CASP. It is worth mentioning that, in order to generate the write matching signal WRMTC for determining whether the data input times NDIN are equal to the actual data write times NDWR, the comparator 230 has a digital filter structure to convert a pulse in the determining result. A width of the pulse is sufficient for performing an operation after the write matching signal WRMTC becomes stable. The control signal EN_t is a status signal. When a chip enable signal (not shown) is changed to be at a high logic level, the control signal EN_t is changed to be at a high logic level. When the pseudo static random access memory 10 completes a startup state and is transitioned to a precharge state, the control signal EN_t is changed to be at a low logic level.

Figure 5B:
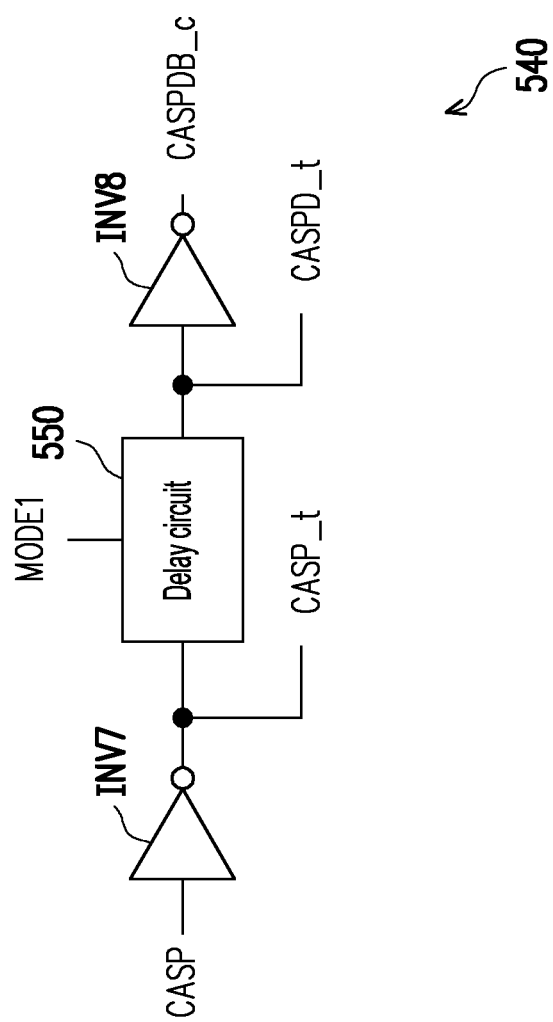
FIG. 5B is a circuit diagram of a signal generating circuit for a comparator according to an embodiment of the present invention.

FIG. 5B is a circuit diagram of a signal generating circuit 540 for a comparator 230 according to an embodiment of the present invention. Referring to FIG. 5B, the signal generating circuit 540 includes phase inverters INV7-INV8 and a delay circuit 550. The signal generating circuit 540 is configured to receive the column address strobe clock signal CASP and a mode signal MODE1 to generate an inverting column address strobe clock signal CASP_t, the control signal CASPD_t, and the control signal CASPDB_c. In particular, the phase inverter INV7 receives the column address strobe clock signal CASP, and generates the inverting column address strobe clock signal CASP_t through inversion. The delay circuit 550 receives the inverting column address strobe clock signal CASP_t and the mode signal MODE1. The delay circuit 550 determines a selected mode, for example, a test mode or a fuse mode according to the mode signal MODE1, to determine a delay time, and delays the inverting column address strobe clock signal CASP_t to generate the control signal CASPD_t. The phase inverter INV8 receives the control signal CASPD_t, and generates the control signal CASPDB_c through inversion.

Figure 6A:
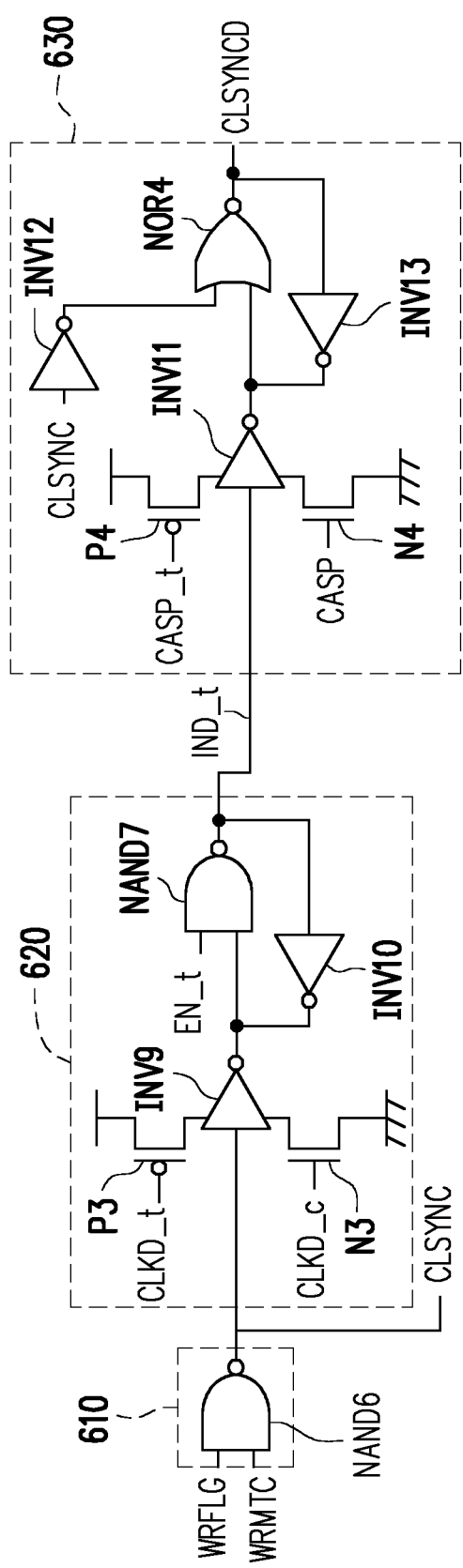
FIG. 6A is a circuit diagram of a synchronization control circuit according to an embodiment of the present invention.

FIG. 6A is a circuit diagram of a synchronization control circuit 370 according to an embodiment of the present invention. Referring to FIG. 3 and FIG. 6, the synchronization control circuit 370 receives the write matching signal WRMTC, the write flag signal WRFLG, and the column address strobe clock signal CASP, and is configured to: determine, based on the write matching signal WRMTC, whether write using an external clock (the reference clock signal CLK) is synchronous with write using an internal clock (the column address strobe clock signal CASP), and perform synchronization control to generate a synchronization determining signal CLSYNC and a preamble signal CLSYNCD. In particular, the synchronization control circuit 370 includes logic circuits 610-630.

The logic circuit 610 includes a NAND gate NAND6. The NAND gate NAND6 receives the write matching signal WRMTC and the write flag signal WRFLG, and generates the synchronization determining signal CLSYNC after a NAND operation.

The logic circuit 620 is coupled to the logic circuit 610. The logic circuit 620 receives the synchronization determining signal CLSYNC, and generates a control signal IND_t after a logic operation. The logic circuit 620 includes a transistor P3, a transistor N3, inverting gates INV9-INV10, and a NAND gate NAND7. A gate of the transistor P3 receives a control signal CLKD_t, an input of the inverting gate INV9 receives the synchronization determining signal CLSYNC, and a gate of the transistor N3 receives a control signal CLKD_c. An input of the NAND gate NAND7 receives the control signal EN_t, and an output of the NAND gate NAND7 provides the control signal IND_t. An input of the inverting gate INV10 receives the control signal IND_t.

The logic circuit 630 is coupled to the logic circuit 620. The logic circuit 630 receives the control signal IND_t, and generates a preamble signal CLSYNCD after a logic operation. The logic circuit 630 includes a transistor P4, a transistor N4, inverting gates INV11-INV13, and a NOR gate NOR4. A gate of the transistor P4 receives the inverting column address strobe clock signal CASP_t, an input of the inverting gate INV11 receives the control signal IND_t, and a gate of transistor N4 receives the column address strobe clock signal CASP. An input of the inverting gate INV12 receives the synchronization determining signal CLSYNC, and an output of the NOR gate provides a preamble signal CLSYNCD. An input of the inverting gate INV13 receives the preamble signal CLSYNCD.

Referring to FIG. 6A, during a write operation, the write flag signal WRFLG is at a high logic level, and the write matching signal WRMTC is also at a high logic level at the beginning of the write operation. Therefore, after a NAND operation performed using the NAND gate NAND6, a synchronization determining signal CLSYNC at a low logic level is generated. Then, when the write matching signal WRMTC is changed to be at a low logic level, the synchronization determining signal CLSYNC is transitioned to be at a high logic level. The synchronization determining signal CLSYNC is transitioned to be at a high logic level at a moment at which the control signal CLKD_t, the control signal CLKD_c, and the control signal IND_t are generated, and a state of the synchronization determining signal CLSYNC is transitioned during a period in which the column address strobe clock signal CASP is at a high logic level.

Figure 6B:
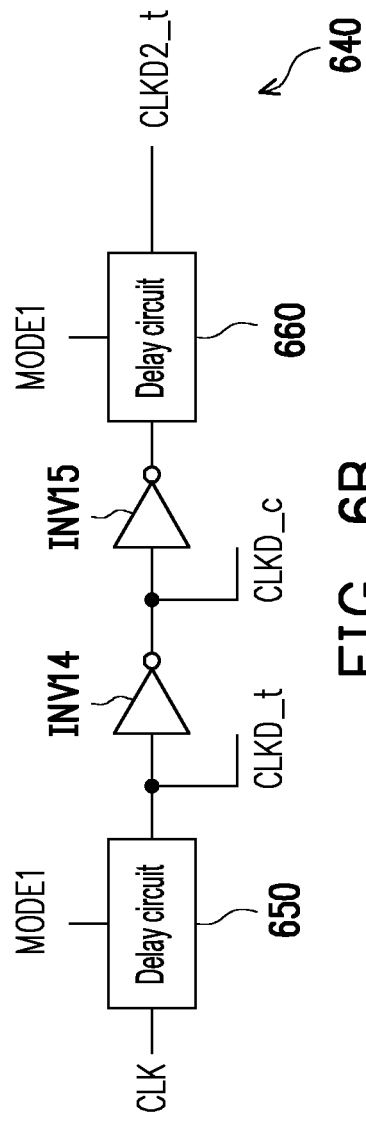
FIG. 6B is a circuit diagram of a signal generating circuit of a synchronization control circuit according to an embodiment of the present invention.
Figure 7:
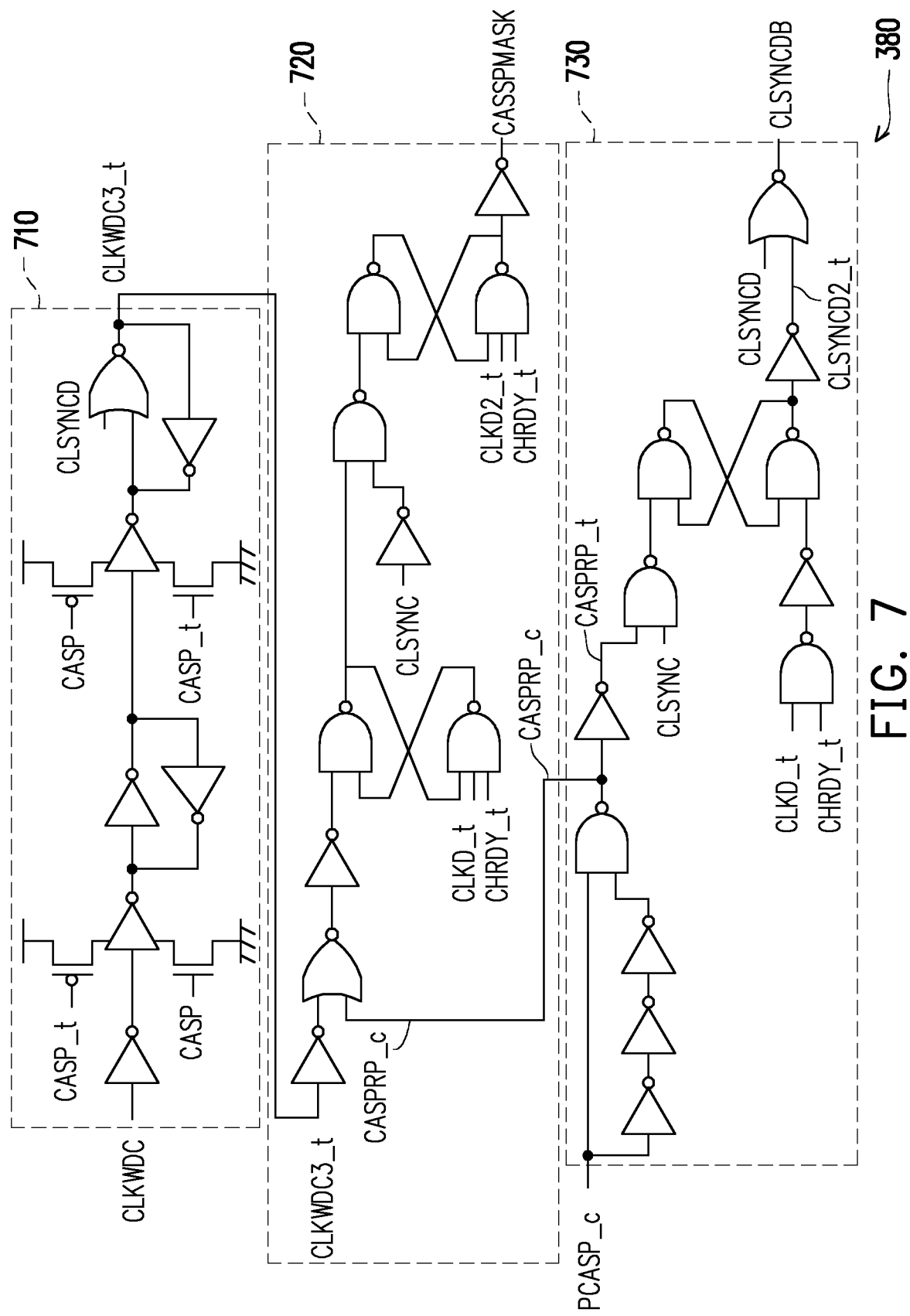
FIG. 7 is a circuit diagram of an asynchronization control circuit according to an embodiment of the present invention.

FIG. 6B is a circuit diagram of a signal generating circuit 640 of a synchronization control circuit according to an embodiment of the present invention. Referring to FIG. 6B, the signal generating circuit 640 includes a delay circuit 650, phase inverters INV14-INV15, and a delay circuit 660. The signal generating circuit 640 is configured to receive the reference clock signal CLK and the mode signal MODE1 to generate a control signal CLKD_t, a control signal CLKD_c, and a control signal CLKD2_t. In particular, the delay circuit 650 receives the reference clock signal CLK and the mode signal MODE1. The delay circuit 650 determines a selected mode, for example, a test mode or a fuse mode according to the mode signal MODE1, to determine a delay time, and delays the reference clock signal CLK to generate the control signal CLKD_t. The phase inverter INV14 receives the control signal CLKD_t, and generates the control signal CLKD_c through inversion. An input of the phase inverter INV15 receives the control signal CLKD_c. The delay circuit 660 is coupled to the input of the phase inverter INV15. The delay circuit 660 determines a selected mode, for example, a test mode or a fuse mode according to the mode signal MODE1, to determine a delay time, and performs a delay operation to generate the control signal CLKD2_t. FIG. 7 is a circuit diagram of an asynchronization control circuit 380 according to an embodiment of the present invention. Referring to FIG. 7, the asynchronization control circuit 380 is configured to generate a synchronization basis generation-forbidding signal CASSPMASK and an inverting preamble signal CLSYNCDB according to the write counting clock signal CLKWDC, the synchronization determining signal CLSYNC, and the preamble signal CLSYNCD. The asynchronization control circuit 380 includes logic circuits 710-730.

The logic circuit 710 is coupled to the counter 210 in the write data determining circuit 140 to receive the write counting clock signal CLKWDC. The logic circuit 710 generates a control signal CLKWDC3_t according to the write counting clock signal CLKWDC, the column address strobe clock signal CASP, the inverting column address strobe clock signal CASP_t, and the preamble signal CLSYNCD.

The logic circuit 720 is coupled to the logic circuit 710 to receive the control signal CLKWDC3_t, and is coupled to the logic circuit 730 to receive the control signal CASPRP_c. The logic circuit 720 provides the synchronization basis generation-forbidding signal CASSPMASK to the one-shot pulse generator 350 according to the control signal CLKWDC3_t, the control signal CASPRP_c, the control signal CLKD_t, the chip charging ready confirmation signal CHRDY_t, the synchronization determining signal CLSYNC, and the control signal CLKD2_t. When chip charging is not completed, the chip charging ready confirmation signal CHRDY_t is at a low logic level. When chip charging is completed, the chip charging ready confirmation signal CHRDY_t is at a high logic level.

The logic circuit 730 is coupled to the logic circuit 720, and is configured to provide the inverting preamble signal CLSYNCDB to the one-shot pulse generator 350 according to a control signal PCASP_c, the synchronization determining signal CLSYNC, the control signal CLKD_t, the chip charging ready confirmation signal CHRDY_t, the preamble signal CLSYNCD, and a preamble signal CLSYNCD2_t.

Figure 8:
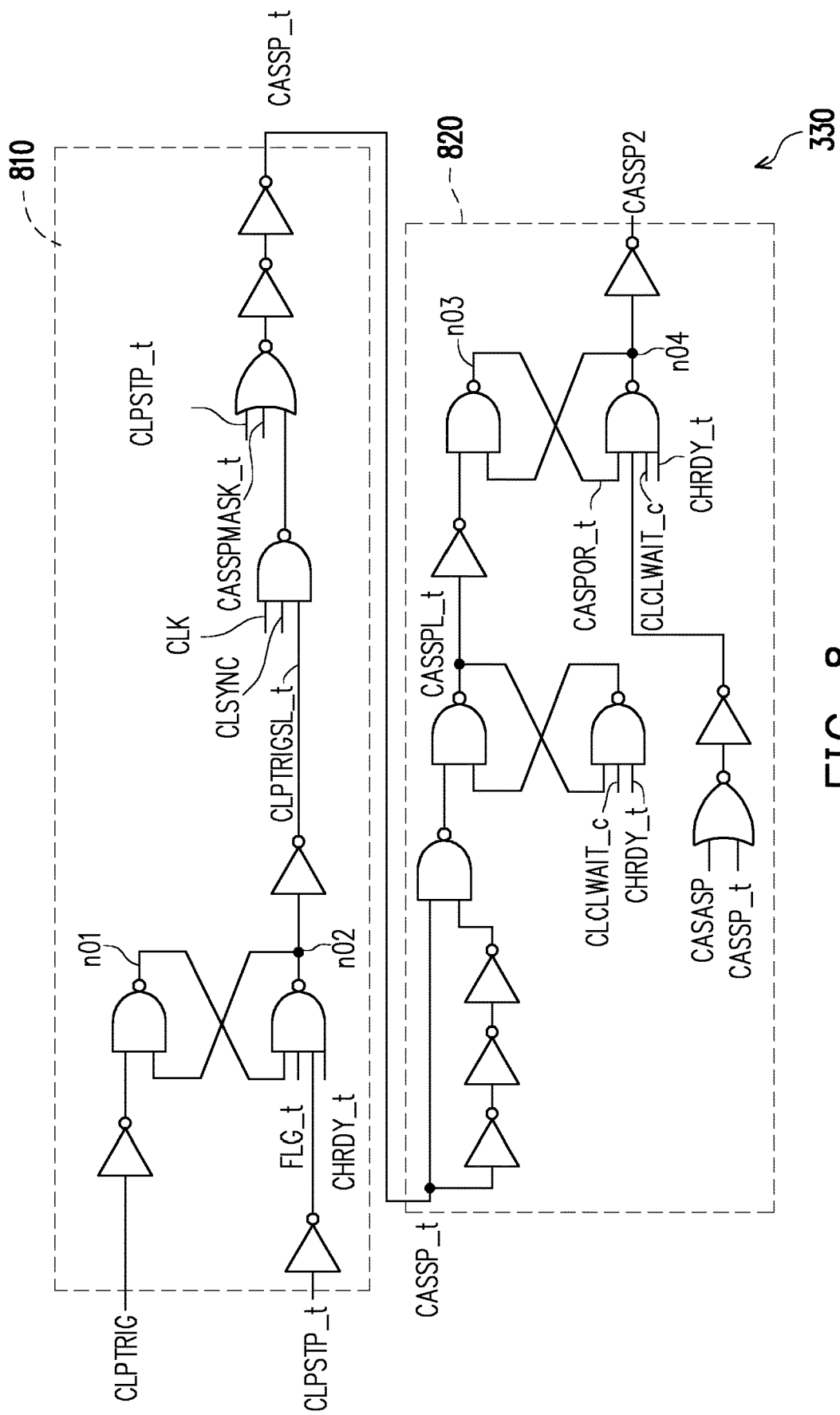
FIG. 8 is a circuit diagram of a synchronous column address strobe clock controller according to an embodiment of the present invention.

FIG. 8 is a circuit diagram of a synchronous column address strobe clock controller 330 according to an embodiment of the present invention. Referring to FIG. 8, the synchronous column address strobe clock controller 330 receives the reference clock signal CLK, the synchronization determining signal CLSYNC, and a trigger status signal CLPTRIG, to generate a corresponding synchronization basis signal CASSP2. The synchronous column address strobe clock controller 330 includes a logic circuit 810 and a logic circuit 820.

The logic circuit 810 receives the trigger status signal CLPTRIG, the synchronization determining signal CLSYNC, and the reference clock signal CLK. The logic circuit 810 generates a control signal CASSP_t according to the trigger status signal CLPTRIG, a control signal CLPSTP_t, a flag signal FLG_t, the reference clock signal CLK, the synchronization determining signal CLSYNC, the chip charging ready confirmation signal CHRDY_t, and the synchronization basis generation-forbidding signal CASSPMASK. The trigger control signal CLPTRIGSL_t is a signal generated in the logic circuit 810. Nodes n01-n02 are voltage nodes in the logic circuit 810. The control signal CLPSTP_t is a pulse signal. When a startup state is completed, the control signal CLPSTP_t is changed to be at a high logic level and the memory is transitioned to a precharge state. The flag signal FLG_t is a status signal. The flag signal FLG_t is changed to be at a high logic level when counting of a delay time starts, and is changed to be at a low logic level when the startup state is completed and the memory is transitioned to the precharge state.

The logic circuit 820 is coupled to the logic circuit 810. The logic circuit 820 receives the control signal CASSP_t, a control signal CLCLWAIT_c, the chip charging ready confirmation signal CHRDY_t, and the asynchronization basis signal CASASP to provide the synchronization basis signal CASSP2 to the one-shot pulse generator 350. The signal CASSP_t is a signal generated in the logic circuit 820. Nodes n03-n04 are voltage nodes in the logic circuit 820.

It needs to be noted that, when the startup state is completed, the control circuit 120 resets signals such as the chip charging ready confirmation signal CHRDY_t, the control signal CLPSTP_t, the flag signal FLG_t, the synchronization basis generation-forbidding signal CASSPMASK, and the trigger status signal CLPTRIG.

Figure 9:
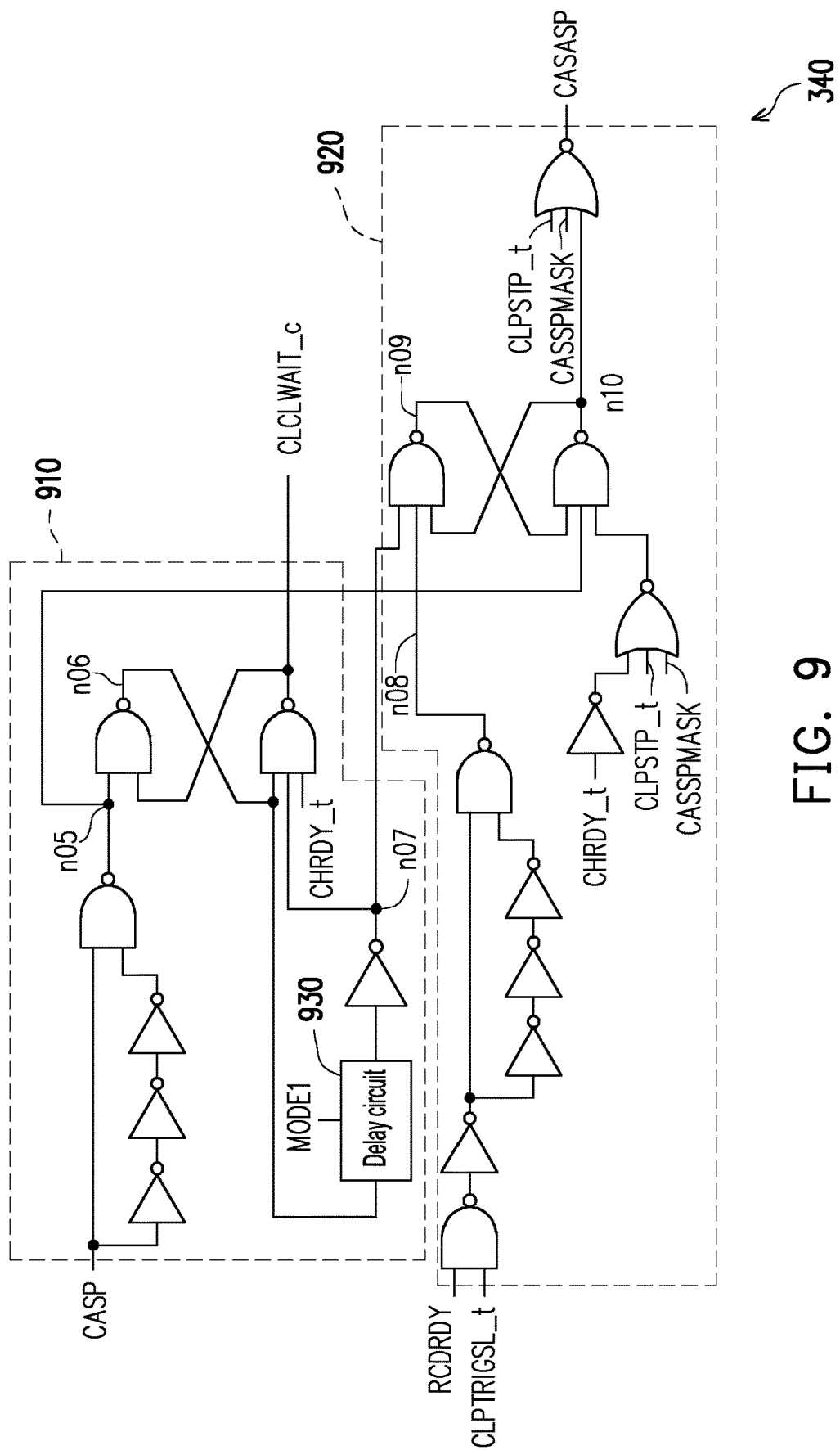
FIG. 9 is a circuit diagram of an asynchronous column address strobe clock controller according to an embodiment of the present invention.

FIG. 9 is a circuit diagram of an asynchronous column address strobe clock controller 340 according to an embodiment of the present invention. Referring to FIG. 9, the asynchronous column address strobe clock controller 340 receives the column address strobe clock signal CASP, the synchronization basis generation-forbidding signal CASSPMASK, the delay ready signal RCDRDY, and the trigger control signal CLPTRIGSL_t to generate a corresponding asynchronization basis signal CASASP. The asynchronous column address strobe clock controller 340 includes a logic circuit 910 and a logic circuit 920.

The logic circuit 910 provides the control signal CLCLWAIT_c to the logic circuit 820 in the synchronous column address strobe clock controller 330 according to the column address strobe clock signal CASP, the mode signal MODE1, and the control signal CLPSTP_t. Nodes n05-n07 are voltage nodes in the logic circuit 910, and the delay circuit 930 receives the mode signal MODE1 to determine a delay time.

The logic circuit 920 is coupled to the logic circuit 910, and is configured to provide the asynchronization basis signal CASASP to the one-shot pulse generator 350 according to the delay ready signal RCDRDY, the trigger control signal CLPTRIGSL_t, the chip charging ready confirmation signal CHRDY_t, the synchronization basis generation-forbidding signal CASSPMASK, and the control signal CLPSTP_t. Nodes n08-n10 are voltage nodes in the logic circuit 920.

Figure 10:
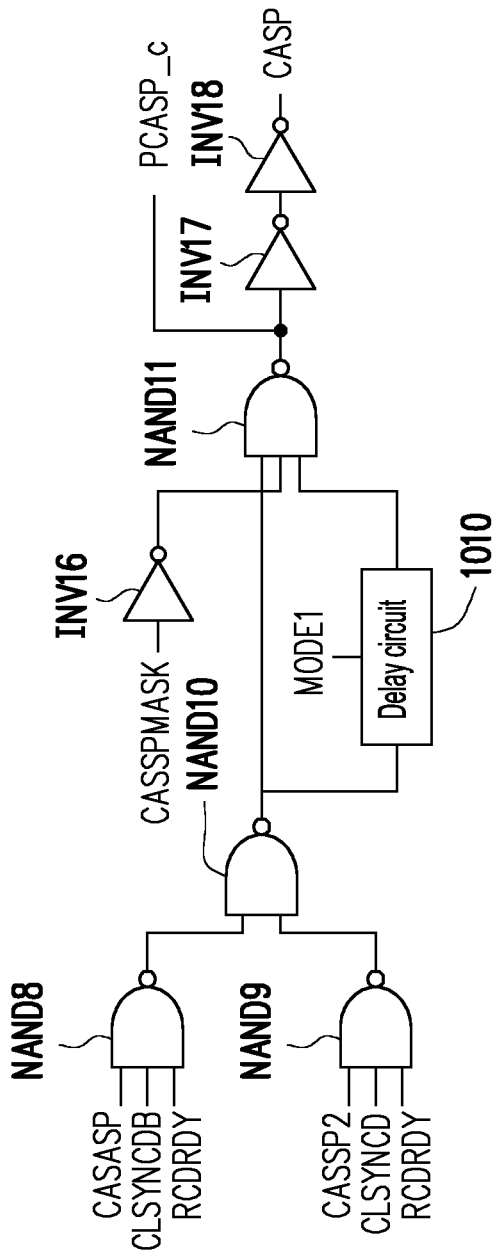
FIG. 10 is a circuit diagram of a one-shot pulse generator according to an embodiment of the present invention.

FIG. 10 is a circuit diagram of a one-shot pulse generator 350 according to an embodiment of the present invention. Referring to FIG. 10, the one-shot pulse generator 350 receives the synchronization basis generation-forbidding signal CASSPMASK, the delay ready signal RCDRDY, the inverting preamble signal CLSYNCDB, the synchronization basis signal CASSP2, the preamble signal CLSYNCD, and the asynchronization basis signal CASASP. The one-shot pulse generator 350 generates a corresponding column address strobe clock signal CASP according to the asynchronization basis signal CASASP in the asynchronous mode, and generates a corresponding column address strobe clock signal CASP according to the synchronization basis signal CASSP2 in the synchronous mode.

The one-shot pulse generator 350 includes NAND gates NAND8-NAND11, inverting gates INV16-INV18, and a delay circuit 1010. An input of the NAND gate NAND8 receives the asynchronization basis signal CASASP, the inverting preamble signal CLSYNCDB, and the delay ready signal RCDRDY. An input of the NAND gate NAND9 receives the synchronization basis signal CASSP2, the preamble signal CLSYNCD, and the delay ready signal RCDRDY. The NAND gate NAND10 is coupled to outputs of the NAND gate NAND8 and the NAND gate NAND9. When all of the asynchronization basis signal CASASP, the inverting preamble signal CLSYNCDB, and the delay ready signal RCDRDY are at a high logic level, or all of the synchronization basis signal CASSP2, the preamble signal CLSYNCD, and the delay ready signal RCDRDY are at a high logic level, the NAND gate NAND10 outputs a high logic level to the NAND gate NAND11. The inverting gate INV16 receives the synchronization basis generation-forbidding signal CASSPMASK, and the delay circuit 1010 receives the mode signal MODEL The NAND gate NAND11 is coupled to the inverting gate INV16, the NAND gate NAND10, and the delay circuit 1010 to generate a control signal PCASP_c. The control signal PCASP_c is buffered by phase inverters INV17-INV18 to generate the column address strobe clock signal CASP.

Accordingly, the column address strobe clock signal CASP is generated by the one-shot pulse generator 350 through an "OR operation" of "asynchronous generation based on the asynchronization basis signal CASASP" and "synchronous generation based on the synchronization basis signal CASSP2". In addition, for the two cases of "asynchronous generation based on the asynchronization basis signal CASASP" and "synchronous generation based on the synchronization basis signal CASSP2", a delay ready signal RCDRDY at a high logic level is required to generate the column address strobe clock signal CASP. A pulse width of the column address strobe clock signal CASP is determined by the delay circuit 1010 in FIG. 10. In an exemplary embodiment, the following three delays are designed to be generated by a delay element of a same type: a delay (not shown) performed by the counter 220 in FIG. 2 after the column address strobe clock signal CASP is received, a delay performed by the delay circuit 550 in FIG. 5B on the column address strobe clock signal CASP received by the signal generating circuit 540, and a delay performed by the delay circuit 930 in FIG. 9 on the asynchronous column address strobe clock controller 340. Therefore, a chip process, a voltage, and a temperature may have a same process variation, and a sufficient timing margin is obtained for all process variations.

Referring back to FIG. 4, when the data input times NDIN are equal to the actual data write times NDWR, after a column selection line CSL signal in a first synchronous mode is enabled, the preamble signal CLSYNCD may be transitioned to be at a high logic level before the reference clock signal CLK rises (FIG. 4A) or after the reference clock signal CLK rises (FIG. 4B). However, in this case, the column selection line CSL signal may fail to maintain a sufficient interval or high logic level time. Therefore, the present invention provides additional solutions as follows.

Figure 11:
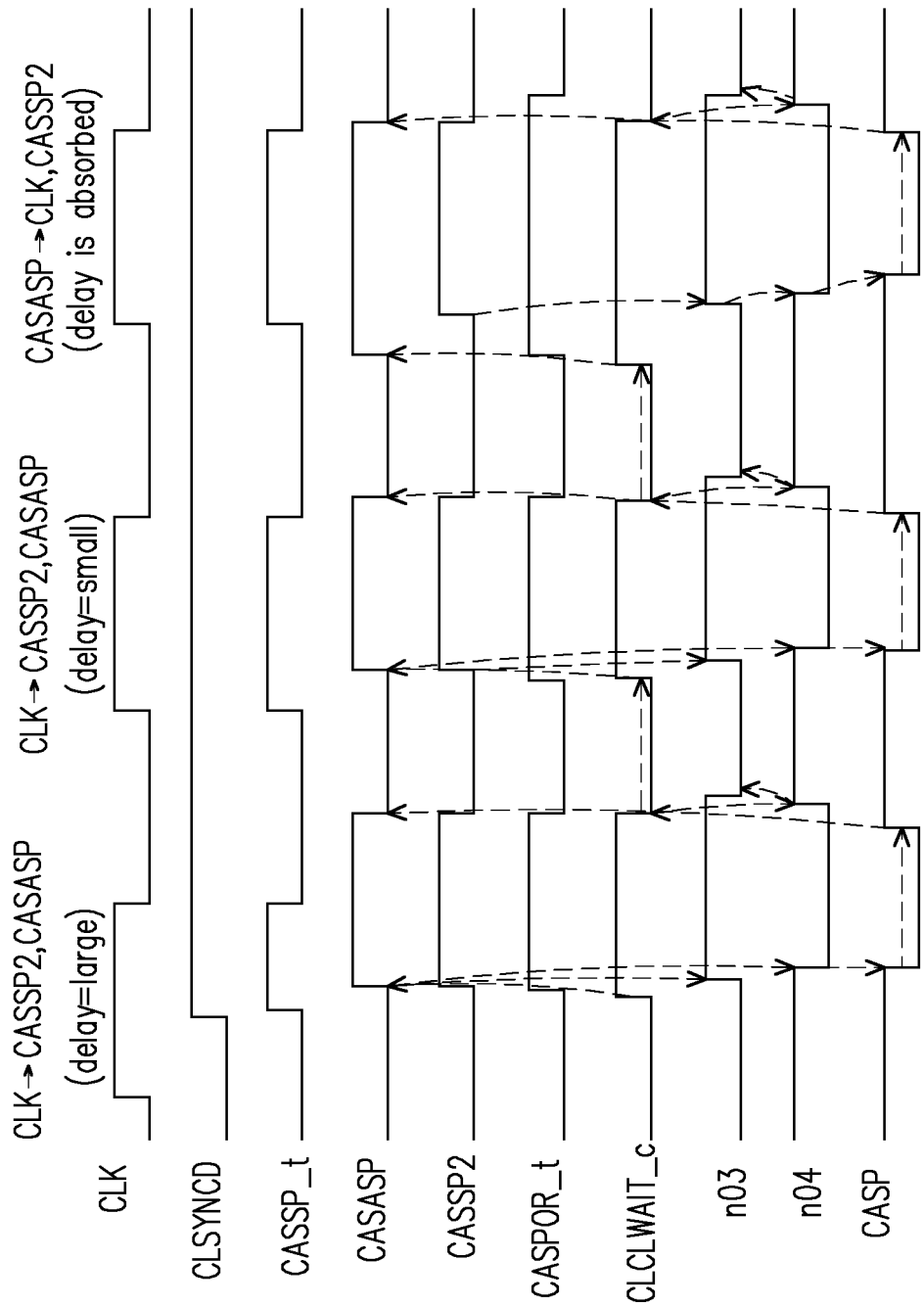
FIG. 11 is a time sequence diagram of a control signal according to another embodiment of the present invention.

FIG. 11 is a time sequence diagram of a control signal according to another embodiment of the present invention. Referring to FIG. 11, the asynchronization basis signal CASASP is delayed using the synchronization basis signal CASSP2 and the control signal CLCLWAIT_c when the preamble signal CLSYNCD is changed to be at a high logic level. After the external clock (reference clock signal CLK) is at a high logic level and the internal clock (asynchronization basis signal CASASP) is changed to be at a high logic level, the column address strobe clock signal CASP starts to be generated. In addition, after a delay time of a necessary pulse width in the column address strobe clock signal CASP ends, generation of the column address strobe clock signal CASP is completed. Then, the synchronization basis signal CASSP2 and the asynchronization basis signal CASASP are reset. In addition, an interval between a current pulse and a next pulse of the column address strobe clock signal CASP may be maintained using a time period during which the control signal CLCLWAIT_c is at a low logic level. In this way, even when the asynchronization basis signal CASASP is delayed until a moment at which the reference clock signal CLK is transitioned to be at a high logic level or until a time period during which the reference clock signal CLK is at a high logic level, a necessary pulse width and interval of the column selection line CSL signal can still be maintained.

As shown in FIG. 11, in the asynchronous mode, a cycle of the column address strobe clock signal CASP is shorter than a cycle of the reference clock signal CLK. Therefore, even if the preamble signal CLSYNCD is used to delay a first synchronization pulse in the column selection line CSL signal, as a pulse of the column selection line CSL signal continues to be generated, a delay between the reference clock signal CLK and the column selection line CSL signal decreases accordingly, and the delay is fully absorbed after a few cycles after the column selection line CSL signal is generated. Next, generation of the column selection line CSL signal and generation of the reference clock signal CLK are completely synchronous.

Referring back to FIG. 4 and FIG. 11, when the reference clock signal CLK has a relatively low frequency or a process variation of the chip is a fast corner, column selection line CSL signal pulses of a number greater than a required number are generated. For this case, the present invention provides an additional implementation method as follows.

Figure 12:
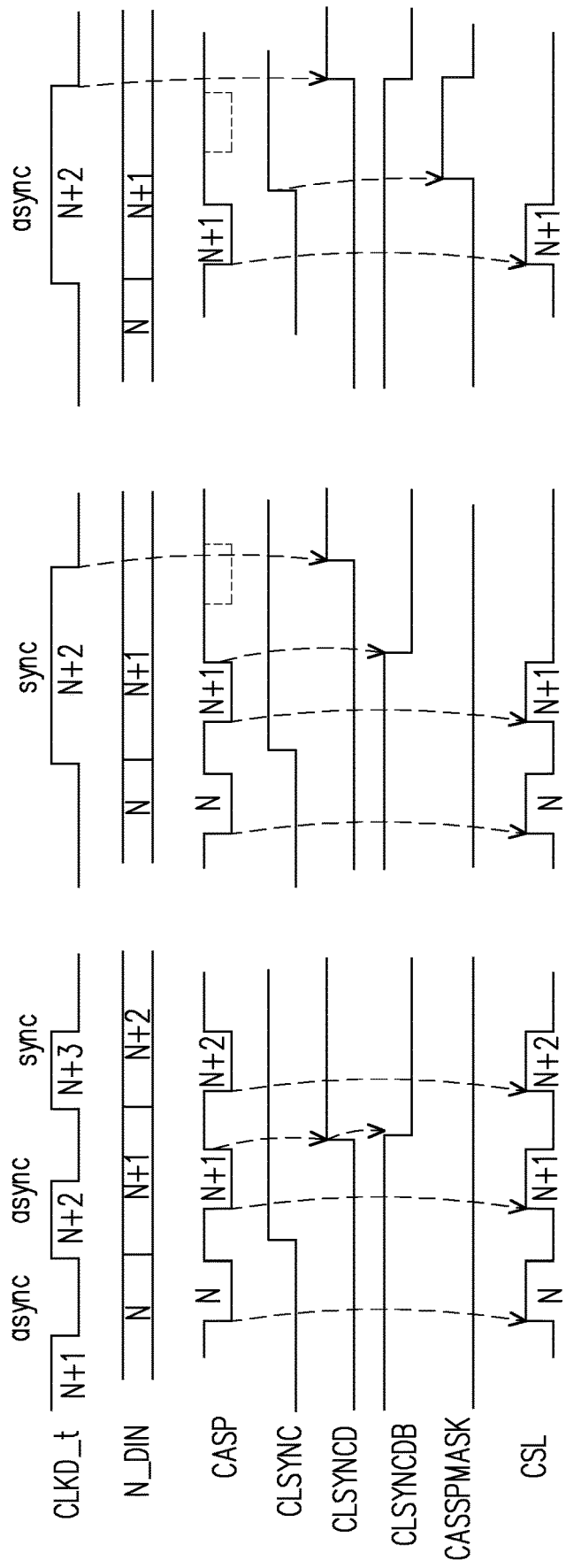
FIG. 12A to FIG. 12C are time sequence diagrams of a control signal according to still another embodiment of the present invention.

FIG. 12A to FIG. 12C are time sequence diagrams of a control signal according to still another embodiment of the present invention. FIG. 12A to FIG. 12C show another method for changing a mode using the column address strobe clock signal CASP, the synchronization determining signal CLSYNC, the preamble signal CLSYNCD, the inverting preamble signal CLSYNCDB, and the synchronization basis generation-forbidding signal CASSPMASK in the present invention. When the data input times NDIN are equal to the actual data write times NDWR (in this case, the synchronization determining signal CLSYNC is at a high logic level) and after a column selection line CSL signal pulse is generated, generation of a next column selection line CSL signal pulse is stopped until the reference clock signal CLK (external CLK) is changed to be at a low logic level. Three cases are described below.

Referring to FIG. 12A, FIG. 12A is an example in which a column address strobe clock signal CASP is not stopped. After the reference clock signal CLK is changed to be at a high logic level and the synchronization determining signal CLSYNC is changed to be at a high logic level, the column address strobe clock signal CASP is changed to be at a low logic level, and then the reference clock signal CLK is changed to be at a low logic level, and the column address strobe clock signal CASP is changed to be at a high logic level. Therefore, the column address strobe clock signal CASP is not stopped.

Referring to FIG. 12B, FIG. 12B is an example of stopping a column address strobe clock signal CASP. After the reference clock signal CLK is changed to be at a high logic level and the synchronization determining signal CLSYNC is changed to be at a high logic level, the column address strobe clock signal CASP is changed to be at a low logic level (then the column address strobe clock signal CASP is changed to be at a high logic level). Therefore, asynchronous generation of the column address strobe clock signal CASP may be stopped using the preamble signal CLSYNCD until the reference clock signal CLK is transitioned to be at a low logic level.

Referring to FIG. 12C, FIG. 12C is another example of stopping generation of a column address strobe clock signal CASP. After the reference clock signal CLK is transitioned to be at a high logic level and the column address strobe clock signal CASP is transitioned to be at a low logic level (then the column address strobe clock signal CASP is changed to be at a high logic level), the synchronization determining signal CLSYNC is transitioned to be at a high logic level and the reference clock signal CLK is transitioned to be at a low logic level. Therefore, synchronous generation of the column address strobe clock signal CASP may be stopped through a change of the synchronization basis generation-forbidding signal CASSPMASK to be at a high logic level.

Figure 13:
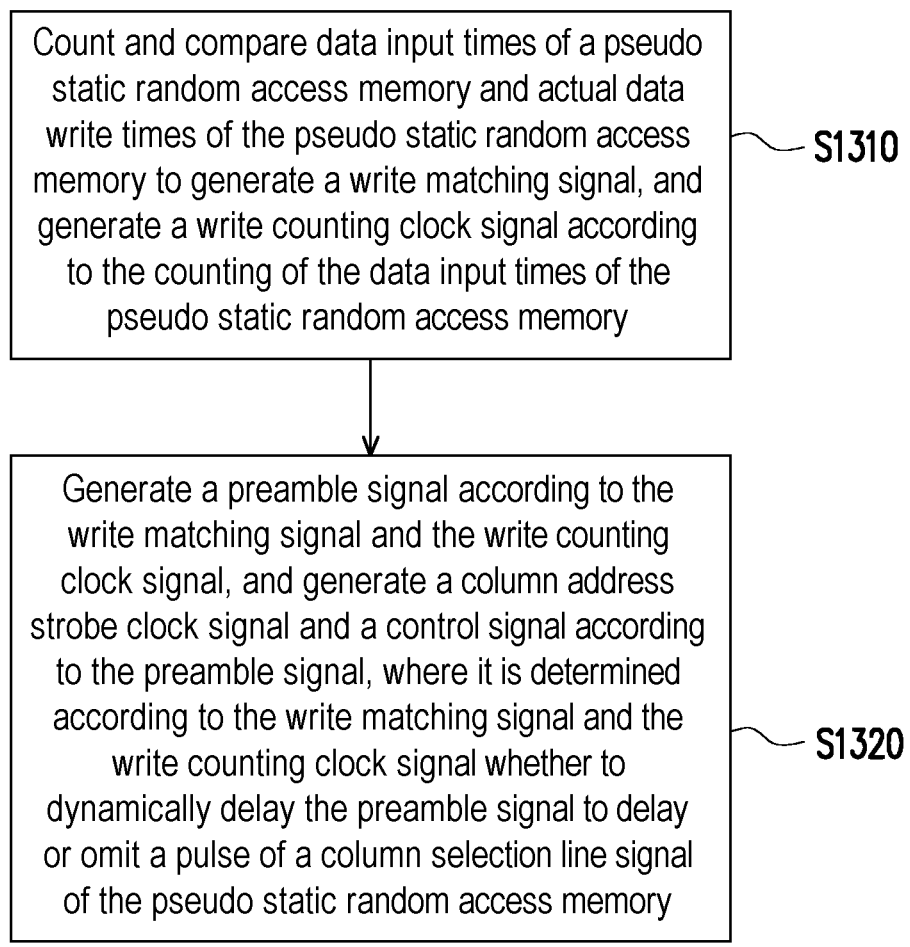
FIG. 13 is a flowchart of a control method according to an embodiment of the present invention.

FIG. 13 is a flowchart of a control method according to an embodiment of the present invention. Referring to FIG. 13, in step 1310, a control circuit counts and compares data input times of the pseudo static random access memory and actual data write times of the pseudo static random access memory to generate a write matching signal, and generates a write counting clock signal according to the counting of the data input times of the pseudo static random access memory. Next, in step 1320, the control circuit generates a preamble signal according to the write matching signal and the write counting clock signal, and generates a column address strobe clock signal and a control signal according to the preamble signal, where the control circuit determines, according to the write matching signal and the write counting clock signal, whether to dynamically delay the preamble signal to delay or omit a pulse of a column selection line signal of the pseudo static random access memory.

In summary, according to the control circuit and the control method of the present invention, a time sequence of the preamble signal is adjusted to generate a column selection line signal with an appropriate time sequence, thereby avoiding a failure or unstable operation of the pseudo static random access memory. In the present invention, the preamble signal is generated through counting and comparison of the data input times and the actual write times of the pseudo static random access memory, and it is determined whether to dynamically delay the preamble signal to delay or omit the pulse of the column selection line signal, thereby avoiding an excessively short with of the pulse of the column selection line signal. Therefore, a failure or unstable operation can be avoided, and a necessary number of column selection line signals can be generated. According to the present invention, the pseudo static random access memory can achieve a higher operating frequency, and can have a reliable process variation.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A control circuit adapted for a pseudo static random access memory, comprising:
a write data determining circuit configured to: count and compare data input times of the pseudo static random access memory and actual data write times of the pseudo static random access memory to generate a write matching signal, and generate a write counting clock signal according to a counting operation of the data input times of the pseudo static random access memory; and
a clock generating circuit coupled to the write data determining circuit and configured to: generate a preamble signal according to the write matching signal and the write counting clock signal, and generate a column address strobe clock signal and a control signal according to the preamble signal, wherein the clock generating circuit determines, according to the write matching signal and the write counting clock signal, whether to dynamically delay the preamble signal to delay or omit a pulse of a column selection line signal of the pseudo static random access memory.

2. The control circuit according to claim 1, wherein the data input times are times that data is input into the pseudo static random access memory from an outside of the pseudo static random access memory, and the actual data write times are times that the data is written into a dynamic random access memory array of the pseudo static random access memory from an inside of the pseudo static random access memory.

3. The control circuit according to claim 1, wherein when the write matching signal is at a first logic level, the clock generating circuit dynamically delays the preamble signal to adjust time sequences of the column address strobe clock signal and the control signal.

4. The control circuit according to claim 1, wherein when the data input times are greater than the actual data write times, the clock generating circuit adjusts time sequences of the column address strobe clock signal and the control signal, so that the pseudo static random access memory performs an asynchronous write operation in a cycle shorter than a cycle of a reference clock signal, and when the data input times are less than or equal to the actual data write times, the clock generating circuit adjusts the time sequences of the column address strobe clock signal and the control signal, so that the pseudo static random access memory performs a synchronous write operation in a cycle same as the cycle of the reference clock signal.

5. The control circuit according to claim 1, further comprising:
an address decoder coupled to the write data determining circuit and configured to: generate a count start signal and a write flag signal, and provide the count start signal and the write flag signal to the write data determining circuit.

6. The control circuit according to claim 1, wherein the pseudo static random access memory comprises an input/output circuit configured to: receive the column address strobe clock signal and the control signal, generate the column selection line signal according to the column address strobe clock signal and the control signal, and sequentially write data into a dynamic random access memory array of the pseudo static random access memory according to the column selection line signal.

7. The control circuit according to claim 1, wherein the write data determining circuit comprises:
a first counter configured to count data input into the pseudo static random access memory from an outside using a reference clock signal during a write operation to generate the data input times;
a second counter configured to count data written into a dynamic random access memory array using the column address strobe clock signal during the write operation to generate the actual data write times, wherein an initial cycle of the column address strobe clock signal is less than a cycle of the reference clock signal; and a comparator coupled to the first counter and the second counter and configured to compare the data input times to the actual data write times, wherein when the data input times are equal to the data actual write times, the write matching signal is transitioned to be at a first logic level.

8. The control circuit according to claim 1, wherein the clock generating circuit comprises:

a synchronization and asynchronization controller configured to receive the write counting clock signal and the write matching signal, and determine, according to the write matching signal, whether a reference clock signal and the column address strobe clock signal are in synchronization and perform synchronization control to generate a synchronization determining signal and the preamble signal, and perform asynchronization control according to the write counting clock signal, the synchronization determining signal and the preamble signal to generate a synchronization basis generation-forbidding signal and an inverting preamble signal;

a synchronous column address strobe clock controller configured to: receive the reference clock signal, the synchronization determining signal, and a trigger status signal, and generate a corresponding synchronization basis signal according to the reference clock signal, the synchronization determining signal, and the trigger status signal;

an asynchronous column address strobe clock controller configured to receive the synchronization basis generation-forbidding signal, a trigger control signal, a delay ready signal, and the column address strobe clock signal, and generate a corresponding asynchronization basis signal according to the synchronization basis generation-forbidding signal, the trigger status signal, the delay ready signal, and the column address strobe clock signal; and a one-shot pulse generator configured to receive the synchronization basis generation-forbidding signal, the delay ready signal, the inverting preamble signal, the synchronization basis signal, the synchronization determining signal, and the asynchronization basis signal, wherein the one-shot pulse generator generates the corresponding column address strobe clock signal according to the asynchronization basis signal in an asynchronous mode, and generates the corresponding column address strobe clock signal according to the synchronization basis signal in a synchronous mode.

9. The control circuit according to claim 1, wherein the clock generating circuit further comprises:

a clock adjuster coupled to the one-shot pulse generator and configured to: receive the column address strobe clock signal and generate the control signal according to the column address strobe clock signal after a predetermined delay time.

10. A control method adapted for a pseudo static random access memory, comprising:

counting and comparing data input times of the pseudo static random access memory and actual data write times of the pseudo static random access memory to generate a write matching signal, and generating a write counting clock signal according to the counting of the data input times of the pseudo static random access memory; and generating a preamble signal according to the write matching signal and the write counting clock signal, and generating a column address strobe clock signal and a control signal according to the preamble signal, wherein the step of generating the preamble signal according to the write matching signal and the write counting clock signal comprises:

determining, according to the write matching signal and the write counting clock signal, whether to dynamically delay the preamble signal to delay or omit a pulse of a column selection line signal of the pseudo static random access memory.

11. The control method according to claim 10, wherein the data input times are times that data is input into the pseudo static random access memory from an outside of the pseudo static random access memory, and the actual data write times are times that the data is written into a dynamic random access memory array from an inside of the pseudo static random access memory.

12. The control method according to claim 10, wherein when the write matching signal is at a first logic level, the preamble signal is dynamically delayed to adjust time sequences of the column address strobe clock signal and the control signal.

13. The control method according to claim 10, wherein when the data input times are greater than the actual data write times, time sequences of the column address strobe clock signal and the control signal are adjusted, so that the pseudo static random access memory performs an asynchronous write operation in a cycle shorter than a cycle of a reference clock signal, and when the data input times are less than or equal to the actual data write times, the time sequences of the column address strobe clock signal and the control signal are adjusted, so that the pseudo static random access memory performs a synchronous write operation in a cycle same as the cycle of the reference clock signal.

* * * * *